United States Patent
Chu et al.

(10) Patent No.: US 9,390,772 B2
(45) Date of Patent: Jul. 12, 2016

(54) SEMICONDUCTOR DEVICE INCLUDING OPTION PADS FOR DETERMINING AN OPERATING STRUCTURE THEREOF, AND A SYSTEM HAVING THE SAME

(71) Applicant: SAMSUNG ELECTRONICS CO., LTD., Suwon-si, Gyeonggi-do (KR)

(72) Inventors: Yong Gyu Chu, Seoul (KR); Hyo Soon Kang, Seoul (KR); Seung Bum Ko, Hwaseong-si (KR); Sang Jae Rhee, Seongnam-si (KR)

(73) Assignee: SAMSUNG ELECTRONICS CO., LTD., Suwon-Si, Gyeongg-Do (KR)

( * ) Notice: Subject to any disclaimer, the term of this patent is extended or adjusted under 35 U.S.C. 154(b) by 363 days.

(21) Appl. No.: 13/833,740

(22) Filed: Mar. 15, 2013

(65) Prior Publication Data

US 2013/0315004 A1 Nov. 28, 2013

Related U.S. Application Data

(60) Provisional application No. 61/650,140, filed on May 22, 2012.

(30) Foreign Application Priority Data

Feb. 7, 2013 (KR) ........................ 10-2013-0013743

(51) Int. Cl.
*G11C 7/00* (2006.01)
*G11C 7/10* (2006.01)
*H01L 21/50* (2006.01)
*H01L 23/48* (2006.01)
*H01L 23/50* (2006.01)

(52) U.S. Cl.
CPC ............... *G11C 7/10* (2013.01); *G11C 7/1012* (2013.01); *G11C 7/1045* (2013.01); *H01L 21/50* (2013.01); *H01L 23/48* (2013.01); *H01L 23/50* (2013.01); *G11C 2207/105* (2013.01); *H01L 2224/04042* (2013.01); *H01L 2224/06155* (2013.01); *H01L 2224/48227* (2013.01); *H01L 2225/0651* (2013.01)

(58) Field of Classification Search
None
See application file for complete search history.

(56) References Cited

U.S. PATENT DOCUMENTS

| | | | |
|---|---|---|---|
| 4,729,118 A | 3/1988 | Gelsomini | |
| 5,239,507 A | 8/1993 | Ohba | |
| 5,537,351 A | 7/1996 | Suwa et al. | |
| 6,028,810 A | 2/2000 | Ooishi | |
| 6,184,067 B1 | 2/2001 | Casper | |
| 7,120,056 B2 * | 10/2006 | Kim | G11C 7/1006 365/185.05 |
| 7,236,012 B2 | 6/2007 | Cho et al. | |
| 7,245,544 B2 | 7/2007 | Rohleder | |
| 7,405,957 B2 | 7/2008 | Schnell et al. | |
| 7,539,826 B2 * | 5/2009 | Chae | G06F 11/1666 711/162 |
| 2004/0120176 A1 | 6/2004 | So et al. | |
| 2007/0291557 A1 | 12/2007 | Nishio et al. | |
| 2010/0244238 A1 | 9/2010 | Yoshikawa et al. | |
| 2012/0086125 A1 | 4/2012 | Kang et al. | |

* cited by examiner

Primary Examiner — Kretelia Graham
(74) *Attorney, Agent, or Firm* — F. Chau & Associates, LLC

(57) ABSTRACT

A semiconductor device includes a memory cell array, pad groups, a first option pad, a second option pad and a data input multiplexer block configured to transmit data, input through all or part of the pad groups, to the memory cell array based on whether the first option pad and a ground are connected to each other, wherein the data input multiplexer block is configured to select first pad groups among the pad groups or second pad groups among the pad groups as the part of the pad groups based on whether the second option pad and the ground are connected to each other.

6 Claims, 9 Drawing Sheets

FIG. 3

| BYTE SEL Option \ X16 Option | No_Bonding | Bonding |
|---|---|---|
| No_Bonding | X32_MODE | X16_MODE1 |
| Bonding | X32_MODE | X16_MODE2 |

SEMICONDUCTOR DEVICE INCLUDING OPTION PADS FOR DETERMINING AN OPERATING STRUCTURE THEREOF, AND A SYSTEM HAVING THE SAME

CROSS-REFERENCE TO RELATED APPLICATIONS

This application claims priority to U.S. Provisional Patent Application No. 61/650,140, filed on May 22, 2012, in the U.S. Patent and Trademark Office and Korean Patent Application No. 10-2013-0013743, filed Feb. 7, 2013, in the Korean Intellectual Property Office, the disclosures of which are incorporated by reference herein in their entireties.

BACKGROUND

1. Technical Field

The present inventive concept relates to a semiconductor device, and more particularly, to a multichip package which may set each data input/output pad of each of a plurality of semiconductor chips differently, a method for manufacturing the same, and a system having the same.

2. Discussion of the Related Art

A multichip package is an electronic package where multiple integrated circuits (ICs), semiconductor dies or other discrete components are packaged onto a unifying substrate. A relatively new development in multichip package technology is the "chip-stack" package. Here, a substrate can be designed to allow certain ICs, memories in particular, to be stacked in a vertical configuration making the resultant footprint smaller. Since area is at a premium in miniature electronics designs, the chip-stack is an attractive option in many applications such as mobile devices.

SUMMARY

An exemplary embodiment of the present inventive concept is directed to a semiconductor device, including a memory cell array, pad groups, a first option pad, a second option pad, and a data input multiplexer block configured to transmit data, input through all or part of the pad groups, to the memory cell array based on whether the first option pad and a ground are connected to each other. The data input multiplexer block is configured to select first pad groups among the pad groups or second pad groups among the pad groups as the part of the pad groups based on whether the second option pad and the ground are connected to each other.

The semiconductor device further includes data input buffer groups each connected to one of the pad groups, and each of the data input buffer groups is configured to be enabled or disabled according to whether the first option pad and the ground are connected to each other and whether the second option pad and the ground are connected to each other.

The semiconductor device further includes data strobe pad groups, data strobe input buffer groups each connected to one of the data strobe pad groups, and data input latch groups each connected between one of the data input buffer groups and the data input multiplexer block. Each of the data strobe input buffer groups is configured to be enabled or disabled according to whether the first option pad and the ground are connected to each other and whether the second option pad and the ground are connected to each other, and each of the data input latch groups is configured to operate based on output signals of the data strobe input buffer group to which it is connected.

The semiconductor device further includes a data output multiplexer block configured to output data from the memory cell array through all or the part of the pad groups based on whether the first option pad and the ground are connected to each other, and the data output multiplexer block is configured to select the first pad groups or the second pad groups as the part of the pad groups based on whether the second option pad and the ground are connected to each other.

The semiconductor device further includes data output buffer groups each connected between the data output multiplexer block and one of the pad groups, and each of the data output buffer groups is configured to be enabled or disabled according to whether the first option pad and the ground are connected to each other and whether the second option pad and the ground are connected to each other.

An exemplary embodiment of the present inventive concept is directed to a system, including a semiconductor device and a host configured to communicate with the semiconductor device. The semiconductor device includes a memory cell array, pad groups, a first option pad, a second option pad, and a data input multiplexer block configured to transmit data, input from the host, to the memory cell array through all or part of the pad groups based on whether the first option pad and a ground are connected to each other. Based on whether the second option pad and the ground are connected to each other, the data input multiplexer block is configured to select first pad groups among the pad groups or second pad groups among the pad groups as the part of the pad groups.

An exemplary embodiment of the present inventive concept is directed to a method for manufacturing a semiconductor device, including connecting a first option pad and a second option pad of a first semiconductor chip to a ground, connecting a first option pad of a second semiconductor chip to the ground and floating a second option pad of the second semiconductor chip, and connecting some pad groups of the first semiconductor chip with corresponding pads of a package, and connecting some pad groups of the second semiconductor chip with corresponding pads of the package. The first and second semiconductor chips have substantially the same pin-out.

The first semiconductor chip and the second semiconductor chip are stacked.

The connected pad groups of the first semiconductor chip and the connected pad groups of the second semiconductor chip are not overlapped with each other.

The pad groups of the first semiconductor chip are connected with the corresponding pads of the package in a horizontal direction with first connectors, and the pad groups of the second semiconductor chip are connected with the corresponding pads of the package in the horizontal direction with second connectors.

The semiconductor device may be embodied in a multichip package (MCP) or a package on package (PoP).

An exemplary embodiment of the present inventive concept is directed to a portable electronic device, including a semiconductor device and a host configured to communicate with the semiconductor device.

The semiconductor device includes a first semiconductor chip including first pad groups, a first option pad and a second option pad, wherein the first and second option pads are connected to a ground, a second semiconductor chip which has substantially the same structure as the first semiconductor chip and includes second pad groups, a first option pad connected to the ground, and a second option pad floated, and a package substrate including package pads. Some of the package pads are connected to some of the first pad groups, and some of the package pads are connected to some of the second pad groups.

The first pad groups and the second pad groups include data input/output pads and data strove signal pads.

An exemplary embodiment of the present inventive concept is directed to a semiconductor device including, a memory cell array; a plurality of input/output pads; a first option pad; a second option pad; and an option control circuit configured to generate a selection signal based on the connectivity of the first and second option pads, wherein all or some of the input/output pads are used to process data in the semiconductor device according to the selection signal.

BRIEF DESCRIPTION OF THE DRAWINGS

FIG. 3 is a table of an output signal of an option control circuit illustrated in FIG. 2, according to an exemplary embodiment of present inventive concept;

DETAILED DESCRIPTION OF THE EMBODIMENTS

Figure 1:
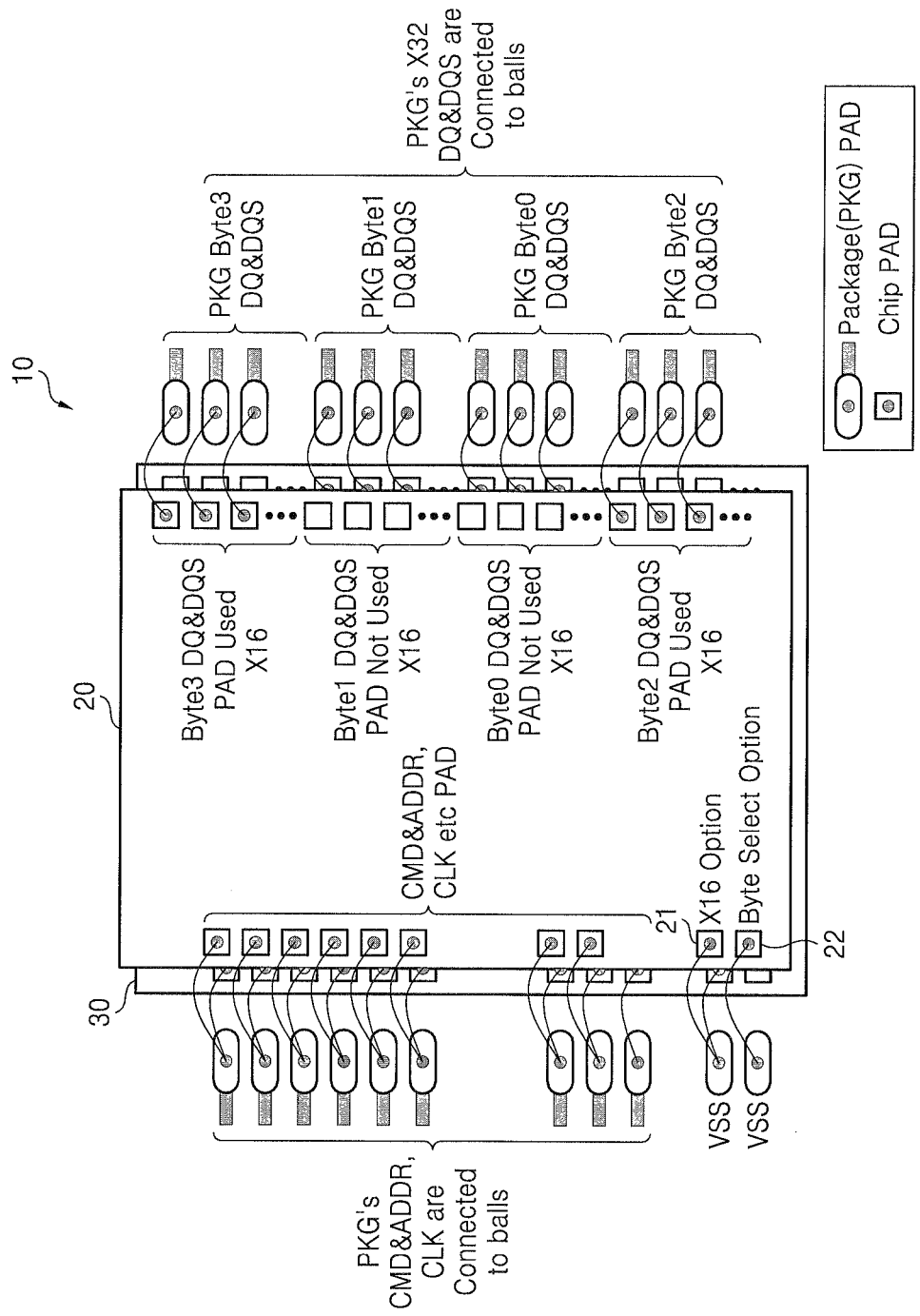
FIG. 1 is a configuration diagram of a semiconductor device according to an exemplary embodiment of the present inventive concept.

FIG. 1 is a configuration diagram of a semiconductor device according to an exemplary embodiment of the present inventive concept.

Referring to FIG. 1, a semiconductor device 10 includes a plurality of semiconductor chips 20 and 30. For convenience of explanation, in the present exemplary embodiment, a semiconductor device 10 including two semiconductor chips (or two dies) 20 and 30 is illustrated; however, the present inventive concept may be applied to a semiconductor device including more than three semiconductor chips, e.g., ten semiconductor chips.

As an example, the semiconductor device 10 may be a multi chip package (MCP) including a plurality of semiconductor chips 20 and 30.

A first semiconductor chip 20 includes pads for receiving control signals such as a command CMD, an address ADDR, and a clock signal CLK which control an operation of the first semiconductor chip 20, data input/output pads for inputting or outputting data, a first option pad 21, and a second option pad 22.

When the semiconductor device 10 is an MCP, each of the pads may be connected to a connection means of the MCP, e.g., a ball such as a solder ball.

The first semiconductor chip 20 may include a memory cell array for storing data, and access control circuits for controlling an access operation, e.g., a write operation or a read operation, on the memory cell array.

A second semiconductor chip 30 may have substantially the same structure as the first semiconductor chip 20.

For example, when the number of data input/output pads for inputting or outputting data is N (N is a natural number), N data input/output pads may be divided into M (M is a natural number) pad groups.

For convenience of explanation in the present exemplary embodiment, it is assumed that N is 32 and M is 4.

Each of the semiconductor chips 20 and 30 may operate in an X32 structure or an X16 structure.

Here, the X32 structure may denote that the number of data input/output pads used to process (e.g., input or output) data in each of the semiconductor chips 20 and 30 is 32, and the X16 structure may denote that the number of data input/output pads used to process data in each the semiconductor chips 20 and 30 is 16.

In each of the semiconductor chips 20 and 30, a first pad group may include eight data input/output pads and is assigned (or named) a first byte Byte0, and a second pad group may include eight data input/output pads and is assigned a second byte Byte1. In addition, a third pad group may include eight data input/output pads and is assigned a third byte Byte2, and a fourth pad group may include eight data input/output pads and is assigned a fourth byte Byte3.

According to an exemplary embodiment of the present inventive concept, each pad group may further include DQS pads for transmitting data strobe signals (DQSs).

As illustrated in FIG. 1, third byte pads Byte2 DQ&DQS (hereinafter "Byte2") of the first semiconductor chip 20, e.g., a top chip, are connected to third package byte pads PKG Byte2 DQ&DQS (hereinafter "PKG Byte2"), and fourth byte pads Byte3 DQ&DQS (hereinafter "Byte3") of the first semiconductor chip 20 are connected to fourth package byte pads PKG Byte3 DQ&DQS (hereinafter "PKG Byte3").

In addition, first byte pads Byte0 DQ&DQS (hereinafter "Byte0") of the second semiconductor chip 30, e.g., a bottom chip, which is located at a bottom of the first semiconductor chip 20, are connected to first package byte pads PKG Byte0 DQ&DQS (hereinafter "PKG Byte0"), and second byte pads Byte1 DQ&DQS (hereinafter "Byte1") of the second semiconductor chip 30 are connected to second package byte pads PKG Byte1 DQ&DQS (hereinafter "PKG Byte1").

Here, a pad indicated as "DQ&DQS" may include a data input/output pad and a DQS pad.

In reference to FIGS. 1 to 7, characters including "BYTE0" may indicate data input/output through a first byte Byte0, data related to that data, or data pads for transmitting that data. Moreover, characters including "BYTE1," "BYTE2," or "BYTE3," may respectively indicate data input/output through a second byte Byte1, a third byte Byte2, or a fourth byte Byte3, data related to that data, or pads for transmitting that data.

Each pad PKG Byte0 DQ&DQS, PKG Byte1 DQ&DQS, PKG Byte2 DQ&DQS, PKG Byte3 DQ&DQS may be connected to a connection means of the MCP, e.g., a ball such as a solder ball. Accordingly, the MCP may communicate with other electronic devices through the connection means.

According to whether the first option pad 21 is connected or bonded to a ground pad VSS, each of the semiconductor chips 20 and 30 may be used or operate in the X32 structure or the X16 structure.

For example, when the first option pad 21 of each of the semiconductor chips 20 and 30 is connected to the ground pad VSS, the each of the semiconductor chips 20 and 30 may be used or operate in the X16 structure.

According to whether the second option pad 22 is connected or bonded to the ground pad VSS, it is determined whether to use the first byte Byte0 and the second byte Byte1 together or to use the third byte Byte2 and the fourth byte Byte3 together among the bytes Byte0 to Byte3 of each of the semiconductor chips 20 and 30.

For example, when the second option pad 22 of the first semiconductor chip 20 having the X16 structure is connected to the ground pad VSS, and the second option pad 22 of the second semiconductor chip 30 having the X16 structure is not connected to the ground pad VSS, the first byte Byte0 and the second byte Byte1 of the first semiconductor chip 20 are not used, and the first byte Byte0 and the second byte Byte1 of the second semiconductor chip 30 are used.

Under these conditions, the third byte Byte 2 and the fourth byte Byte3 of the first semiconductor chip 20 are used, and the third byte Byte2 and the fourth byte Byte3 of the second semiconductor chip 30 are not used.

Figure 2:
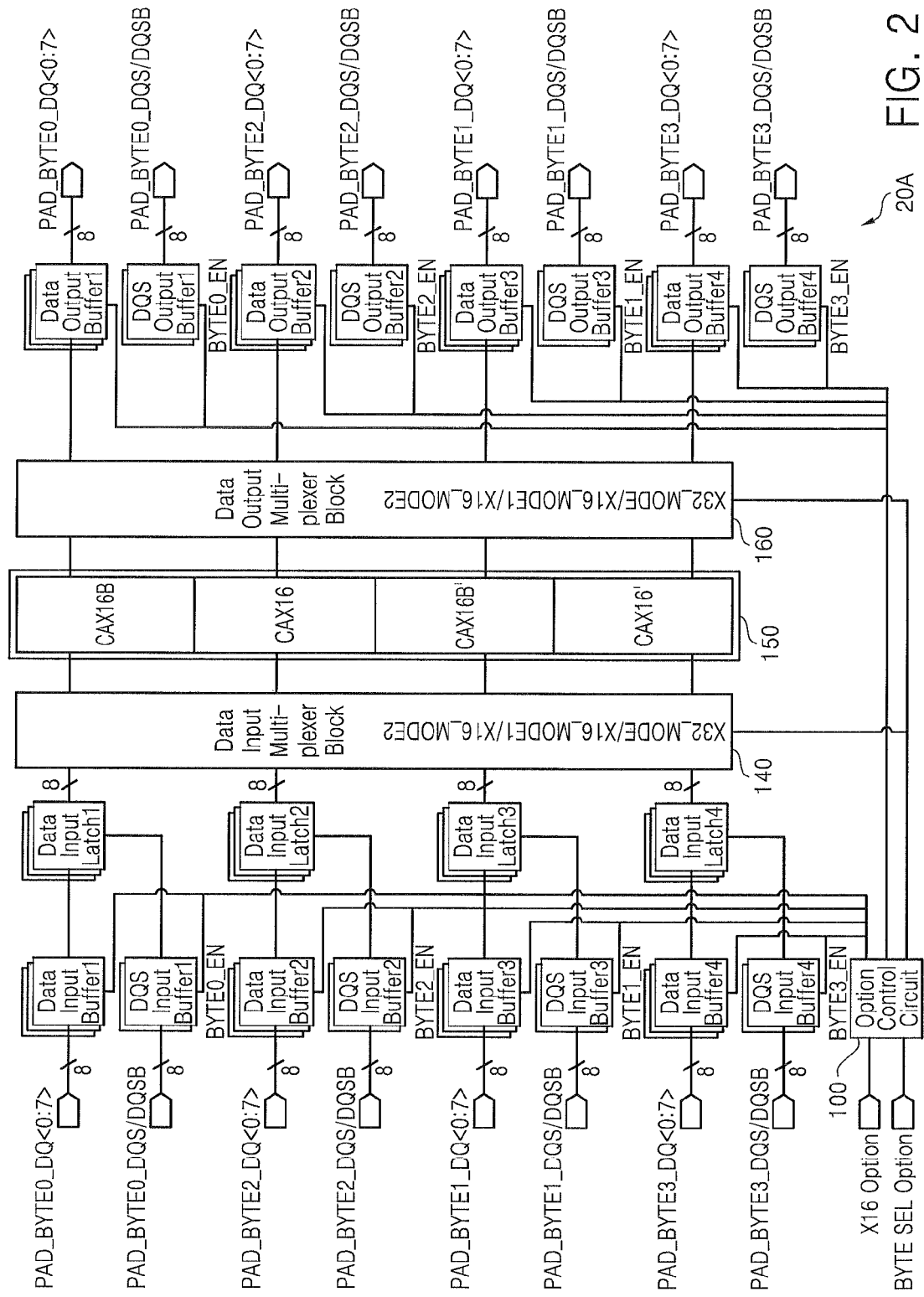
FIG. 2 is a block diagram of a first semiconductor chip illustrated in FIG. 1, according to an exemplary embodiment of the present inventive concept.

FIG. 2 is a block diagram of the first semiconductor chip 20 illustrated in FIG. 1, according to an exemplary embodiment of the present inventive concept.

A semiconductor chip 20A of FIG. 2 is an exemplary embodiment of the first semiconductor chip 20 illustrated in FIG. 1 and includes data input buffer groups Data Input Buffer1 to Data Input Buffer4, DQS input buffer groups DQS Input Buffer1 to DQS Input Buffer 4, an option control circuit 100, data input latch groups Data Input Latch1 to Data Input Latch4, a data input multiplexer block 140, a memory cell array 150, a data output multiplexer block 160, data output buffer groups Data Output Buffer1 to Data Output Buffer4, DQS output buffer groups DQS Output Buffer1 to DQS Output Buffer4, and input/output pad groups PAD_BYTE0_DQ<0:7>, PAD_BYTE0_DQS/DQSB, PAD_BYTE2_DQ<0:7>, PAD_BYTE2_DQS/DQSB, PAD_BYTE1_DQ<0:7>, PAD_BYTE1_DQS/DQSB, PAD_BYTE3_DQ<0:7>, and PAD_BYTE3_DQS/DQSB.

The package first byte pads PKG Byte0 DQ&DQS of FIG. 1 may include the input/output pads PAD_BYTE0_DQ<0:7> and PAD_BYTE0_DQS/DQSB of FIG. 2.

The package second byte pads PKG Byte1 DQ&DQS of FIG. 1 may include the input/output pads PAD_BYTE1_DQ<0:7> and PAD_BYTE1_DSQ&DSQB of FIG. 2.

The package third byte pads PKG Byte2 DQ&DQS of FIG. 1 may include the input/output pads PAD_BYTE2_DQ<0:7> and PAD_BYTE2_DQS/DQSB of FIG. 2.

The package fourth byte pads PKG Byte3 DQ&DQS of FIG. 1 may include the input/output pads PAD_BYTE3_DQ<0:7> and PAD_BYTE3_DSQ&DSQB of FIG. 2.

The option control circuit 100 generates a plurality of enable signals BYTE0_EN to BYTE3_EN according to whether the first option pad 21 is connected (e.g., bonded) to the ground pad VSS and whether the second option pad 22 is connected (e.g., bonded) to the ground pad VSS.

In response to a first enable signal BYTE0_EN, the data input buffers Data Input Buffer1 buffer signals input through the pads PAD_BYTE0_DQ<0:7>. In response to the first enable signal BYTE0_EN, the DQS input buffers DQS Input Buffer1 buffer DQS signals input through the pads PAD_BYTE0_DQS/DQSB.

The data input latches Data Input Latch1 latch output signals of the data input buffers DATA Input Buffer1 in response to buffered DQS signals output from the DQS input buffers DQS Input Buffer1.

In response to a third enable signal BYTE2_EN, the data input buffers Data Input Buffer2 buffer signals input through the pads PAD_BYTE2_DQ<0:7>.

In response to the third enable signal BYTE2_EN, the DQS input buffers DQS Input Buffer2 buffer DQS signals input through the pads PAD_BYTE2_DQS/DQSB.

The data input latches Data Input Latch2 latch output signals of the data input buffers Data Input Buffer2 in response to buffered DQS signals output from the DQS input buffers DQS Input Buffer2.

In response to a second enable signal BYTE1_EN, the data input buffers Data Input Buffer3 buffer signals input through the pads PAD_BYTE1_DQ<0:7>. In response to the second enable signal BYTE1_EN, the DQS input buffers DQS Input Buffer3 buffer DQS signals input through the pads PAD_BYTE1_DQS/DQSB.

The data input latches Data Input Latch3 latch output signals of the data input buffers Data Input Buffer3 in response to buffered DQS signals output from the DQS input buffers DQS Input Buffer3.

In response to a fourth enable signal BYTE3_EN, the data input buffers Data Input Buffer4 buffer signals input through the pads PAD_BYTE3_DQ<0:7>. In response to the fourth enable signal BYTE3_EN, the DQS input buffers DQS Input Buffer4 buffer DQS signals input through the pads PAD_BYTE3_DQS/DQSB. The data input latches Data Input Latch4 latch output signals of the data input buffers Data Input Buffer4 in response to buffered DQS signals output from the DQS input buffers DQS Input Buffer4.

The option control circuit 100 may generate a first selection signal X32_MODE, a second selection signal X16_MODE1, or a third selection signal X16_MODE2 according to whether a first option pad X16 Option (e.g., 21 of FIG. 1) and a ground pad VSS are connected and whether a second option pad BYTE SEL Option (e.g., 22 of FIG. 1) and the ground pad VSS are connected.

The option control circuit 100 may be embodied in a fusing circuit. For example, the fusing circuit may include fuses, anti-fuses, or e-fuses. Accordingly, the fusing circuit may generate the first selection signal X32_MODE, the second selection signal X16_MODE1, or the third selection signal X16_MODE2 based on whether one, none or more than one of the fuses are cut.

FIG. 3 is a table of an output signal of the option control circuit 100 illustrated in FIG. 2, according to an exemplary embodiment of the inventive concept.

Referring to FIG. 3, when the first option pad X16 Option (e.g., 21 of FIG. 1) of each of the semiconductor chips 20 and 30 is not connected (e.g., No_Bonding in FIG. 3) to the ground pad VSS, the option control circuit 100 of each of the semiconductor chips 20 and 30 may output the first selection signal X32_MODE to each of the multiplexers block 140 and 160 of each of the semiconductor chips 20 and 30 regardless of whether the second option pad BYTE SEL Option (e.g., 22 of FIG. 1) is connected to the ground pad VSS. Accordingly, each of the semiconductor devices 20 and 30 may operate in an X32 structure.

When the first option pad X16 Option of each of the semiconductor chips 20 and 30 is connected (e.g., Bonding in FIG. 3) to the ground pad VSS, the second option pad BYTE SEL option of the first semiconductor chip 20 is connected to the ground pad VSS and a second option pad of the second semiconductor chip 30 is not connected to the ground pad VSS, the option control circuit 100 of the first semiconductor chip 20 outputs the third selection signal X16_MODE2 to each of the multiplexer blocks 140 and 160, and an option control circuit of the second semiconductor chip 30 outputs the second selection signal X16_MODE1 to each of the multiplexer blocks 140 and 160.

Figure 4:
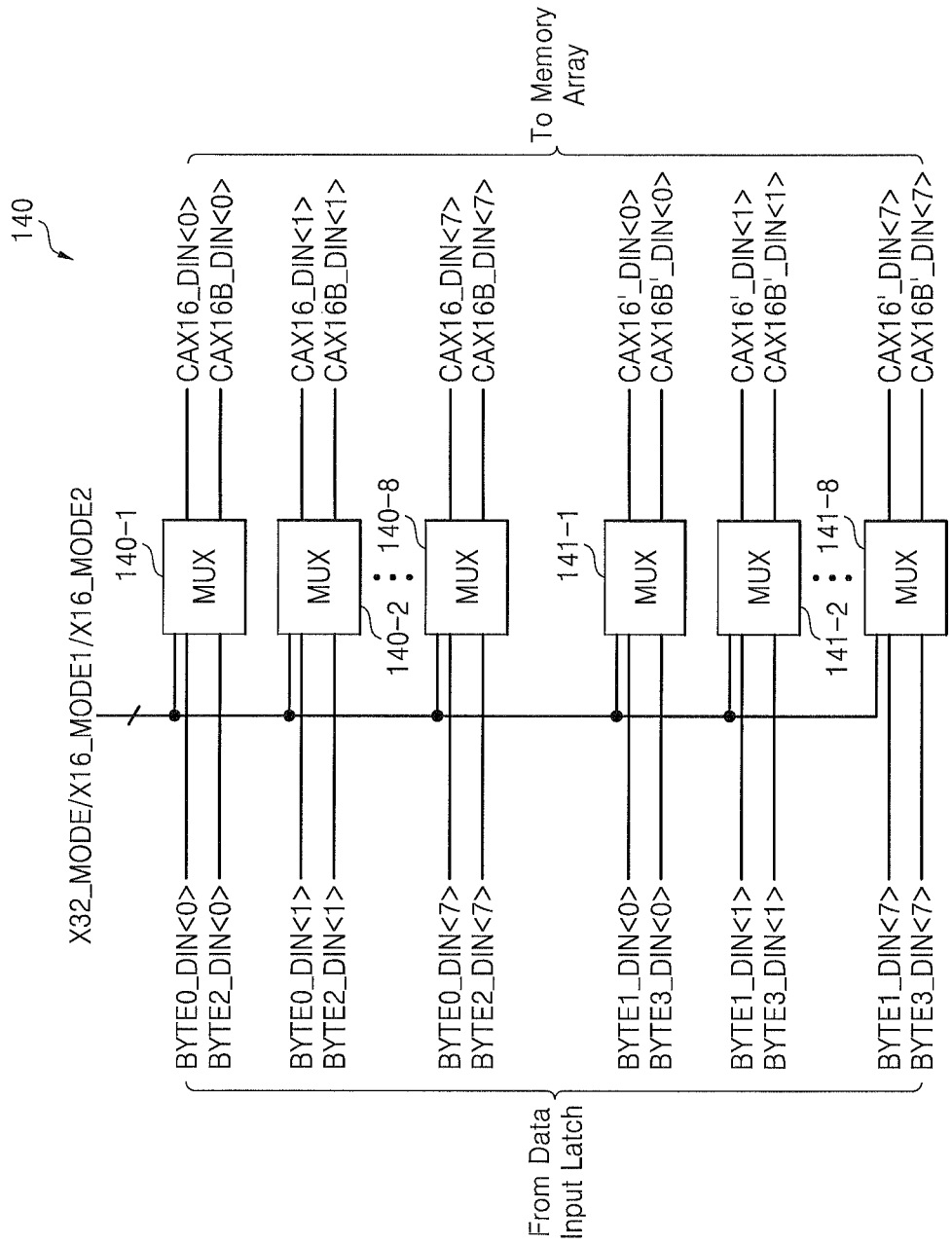
FIG. 4 is a block diagram of a data input multiplexer block illustrated in FIG. 2, according to an exemplary embodiment of present inventive concept.

FIG. 4 is a block diagram of the data input multiplexer block 140 illustrated in FIG. 2, according to an exemplary embodiment of the present inventive concept.

Referring to FIG. 4, the data input multiplexer block 140 includes a first group of multiplexers 140-1 to 140-8 and a second group of multiplexers 141-1 to 141-8.

Each of the multiplexers 140-1 to 140-8 selectively outputs one of each data BYTE0_DIN<0> to BYTE0_DIN<7>, output from the input data latch Data Input Latch1, and each data BYTE2_DIN<0> to BYTE2_DIN<7>, output from the input data latch Data Input Latch2, in response to a corresponding selection signal X32_MODE, X16_MODE1 or X16_MODE2.

Each output signal CAX16_DIN<0> to CAX16_DIN<7> and CAX16B_DIN<0> to CAX16B_DIN<7>, output from each of the multiplexers 140-1 to 140-8, is output to the memory cell array 150.

Each of the multiplexers 141-1 to 141-8 selectively outputs one of each data BYTE1_DIN<0> to BYTE1_DIN<7>, output from the input data latch Data Input Latch3, and each data BYTE3_DIN<0> to BYTE3_DIN<7>, output from the input data latch Data Input Latch4, in response to a corresponding selection signal X32_MDE, X16_MODE1, or X16_MODE2.

Each output signal CAX16'_DIN<0> to CAX16'_DIN<7> and CAX16B'_DIN<0> to CAX16B'_DIN<7>, output from each of the multiplexers 141-1 to 141-8, is output to the memory cell array 150.

The memory cell array 150, as shown in FIG. 2, includes data storage regions CAX16, CAX16B, CAX16' and CAX16B'.

Figure 5:
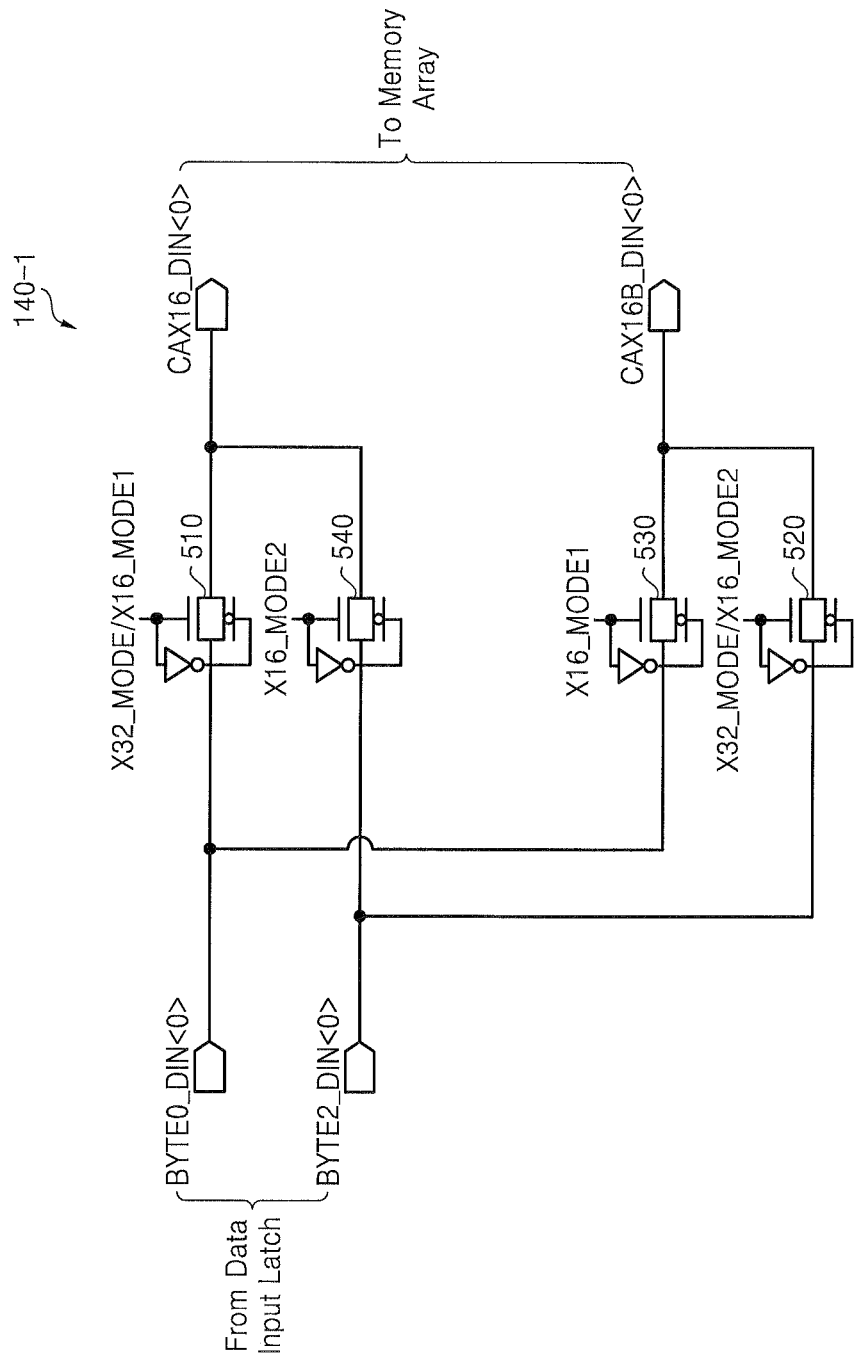
FIG. 5 is a circuit diagram of a first data input multiplexer illustrated in FIG. 4, according to an exemplary embodiment of present inventive concept.

FIG. 5 is a circuit diagram of the first data input multiplexer 140 illustrated in FIG. 4, according to an exemplary embodiment of the present inventive concept.

Each of the multiplexers 140-1 to 140-8 and 141-1 to 141-8 illustrated in FIG. 4 may have substantially the same structure as each other. Accordingly, for convenience of explanation, a structure and an operation of the first data input multiplexer 140-1 is described referring to FIGS. 4 and 5.

A transmission gate 510 outputs data BYTE0_DIN<0> output from the data input latch Data Input Latch1 as output data CAX16_DIN<0> in response to the first selection signal X32_MODE having a high level.

In addition, a transmission gate 520 outputs data BYTE2_DIN<0>, output from the data input latch Data Input Latch2, as output data CAX16B_DIN<0> in response to the first selection signal X32_MODE having the high level.

When the second selection signal X16_MODE1 has the high level, the first data input multiplexer 140-1 outputs the input data BYTE0_DIN<0> as each of the output data CAX16_DIN<0> and CAX16B_DIN<0> via the transmission gate 510 and a transmission gate 530.

However, when the third selection signal X16_MODE2 has the high level, the first data input multiplexer 140-1 outputs the input data BYTE2_DIN<0> as each of the output data CAX16_DIN<0> and CAX16B_DIN<0> via the transmission gate 520 and a transmission gate 540.

Figure 6:
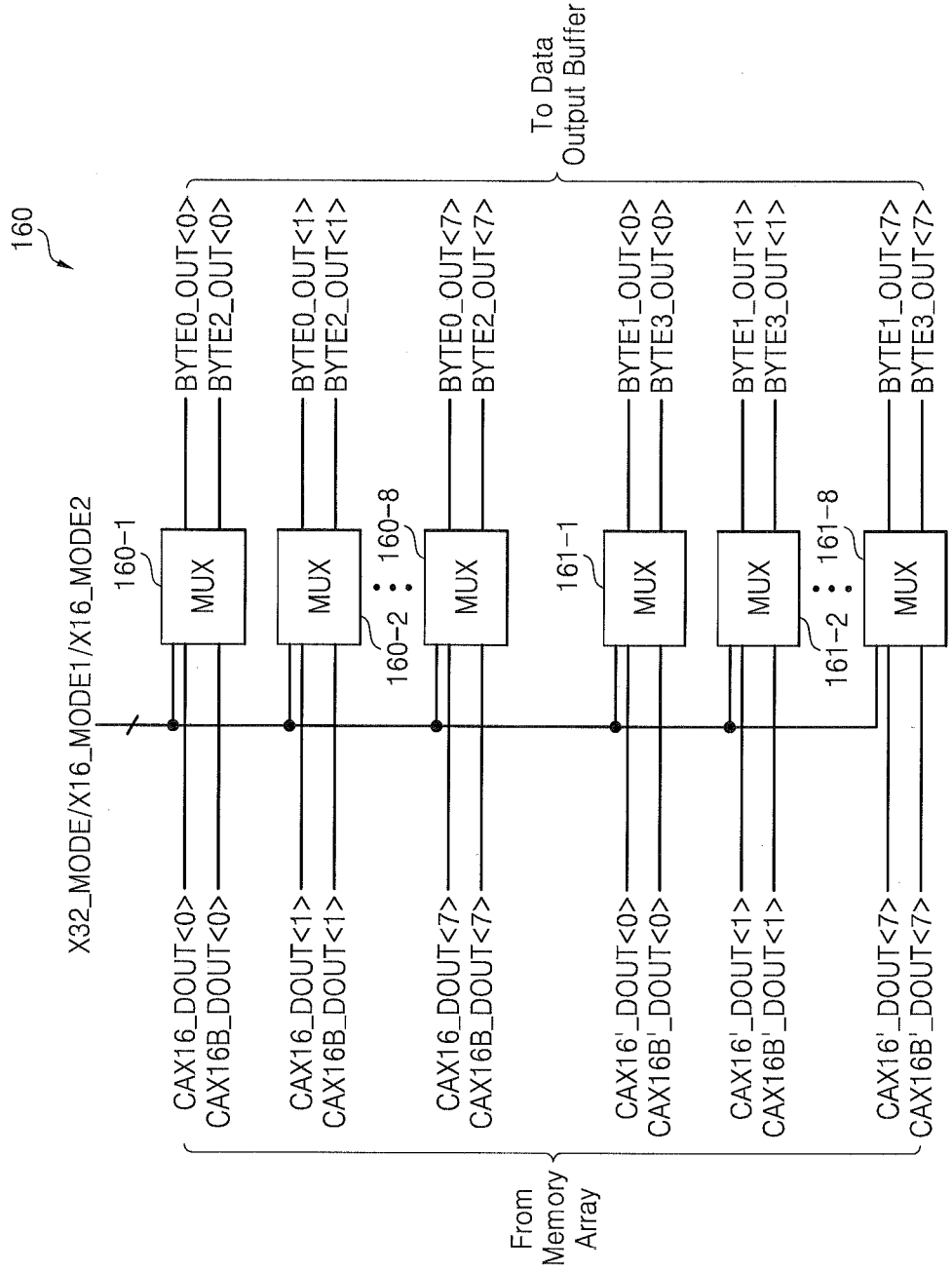
FIG. 6 is a block diagram of a data output multiplexer block illustrated in FIG. 2, according to an exemplary embodiment of present inventive concept.

FIG. 6 is a block diagram of the data output multiplexer block 160 illustrated in FIG. 2, according to an exemplary embodiment of present inventive concept.

Referring to FIG. 6, the data output multiplexer block 160 includes a first group of multiplexers 160-1 to 160-8 and a second group of multiplexers 161-1 to 161-8.

Each of the multiplexers 160-1 to 160-8 selectively outputs one of each of data CAX16_DOUT<0> to CAX16_DOUT<7> and each of data CAX16B_DOUT<0> to CAX16B_DOUT<7>, output from the memory cell array 150, in response to a corresponding selection signal X32_MODE, X16_MODE1 or X16_MODE2.

Each output data BYTE0_OUT<0> to BYTE0_OUT<7> and BYTE2_OUT<0> to BYTE2-OUT<7>, output from the multiplexers 160-1 to 160-8, is transmitted to the data output buffers Data Output Buffer1 and Data Output Buffer2.

Each of the multiplexers 161-1 to 161-8 selectively outputs one of each of data CAX16'_DOUT<0> to CAX16'_DOUT<7> and each of data CAX16B'_DOUT<0> to CAX16B'_DOUT<7>, output from the memory cell array 150, in response to a corresponding selection signal X32_MODE, X16_MODE1, or X16_MODE2.

Each output data BYTE1_OUT<0> to BYTE1_OUT<7> and BYTE3_OUT<0> to BYTE3_OUT<7>, output from the multiplexers 161-1 to 161-8, is transmitted to the data output buffers Data Output Buffer3 and Data Output Buffer4.

In response to the first enable signal BYTE0_EN, with reference to FIG. 2, the data output buffer Data Output Buffer1 and the DQS output buffer DQS Output Buffer1 are enabled.

In response to the third enable signal BYTE2_EN, with reference to FIG. 2, the data output buffer Data Output Buffer2 and the DQS output buffer DQS Output Buffer2 are enabled.

In response to the second enable signal BYTE1_EN, with reference to FIG. 2, the data output buffer Data Output Buffer3 and the DQS output buffer DQS Output Buffer3 are enabled.

In response to the fourth enable signal BYTE3_EN, with reference to FIG. 2, the data output buffer Data Output Buffer4 and the DQS output buffer DQS Output Buffer4 are enabled.

Figure 7:
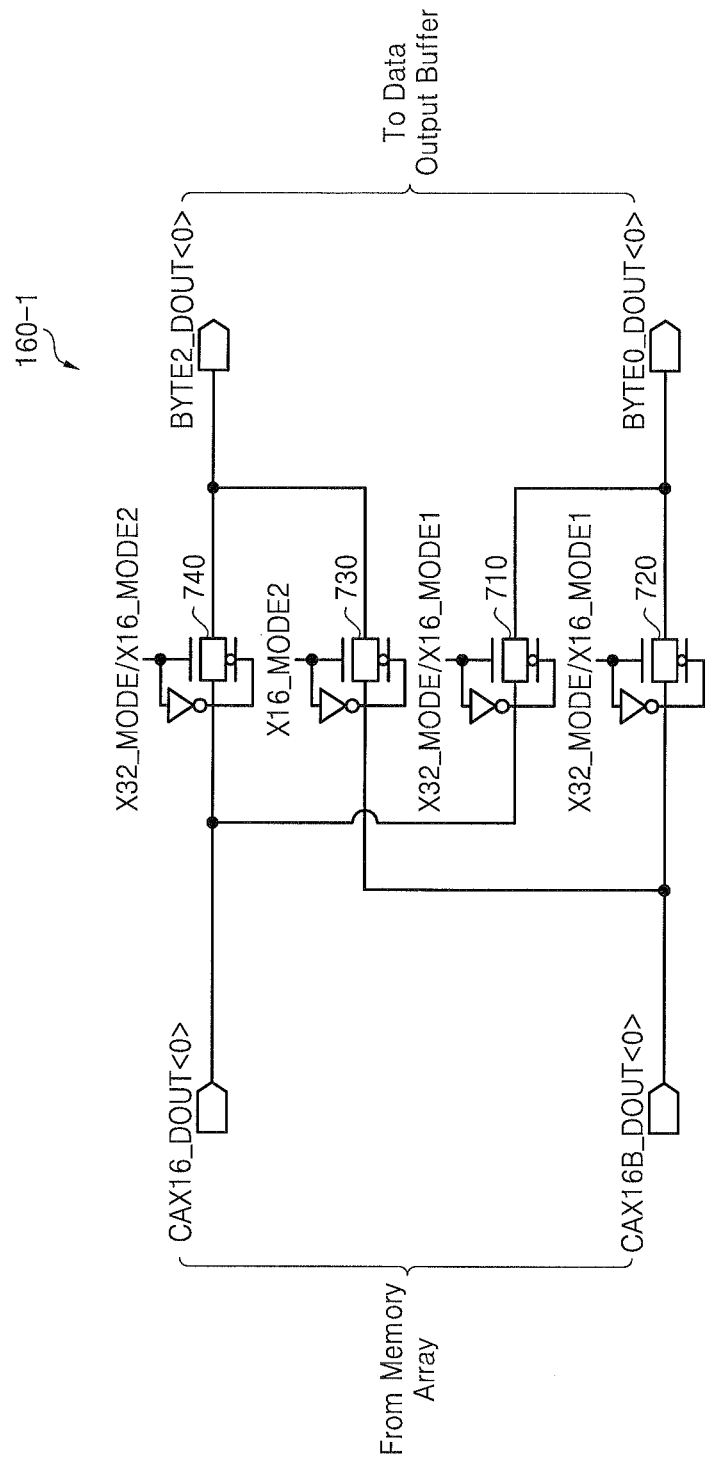
FIG. 7 is a circuit diagram of a first data output multiplexer illustrated in FIG. 6, according to an exemplary embodiment of present inventive concept.

FIG. 7 is a circuit diagram of the first data output multiplexer 160 illustrated in FIG. 6, according to an exemplary embodiment of present inventive concept.

Each of the multiplexers 160-1 to 160-8 and 161-1 to 161-8 illustrated in FIG. 6 may have substantially the same structure as each other. Accordingly, for convenience of explanation, a structure and an operation of the first data output multiplexer 160-1 is described referring to FIGS. 6 and 7.

When the second selection signal X16_MODE1 has the high level, the first data output multiplexer 160-1 transmits the data CAX16_OUT<0>, output from the CAX16 region of the memory cell array 150, and the data CAX16B_OUT<0>, output from the CAX16B region of the memory cell array 150, to the data output buffer Data Output Buffer1 as BYTE0_DOUT<0> via transmission gates 710 and 720.

When the third selection signal X16_MODE2 has the high level, the first data output multiplexer 160-1 transmits the data CAX16_OUT<0>, output from the CAX16 region of the memory cell array 150, and the data CAX16B_OUT<0>, output from the CAX16B region of the memory cell array 150, to the data output buffer Data Output Buffer2 as BYTE2_DOUT<0> via transmission gates 730 and 740.

In the exemplary embodiments of the present inventive concept explained by referring to FIGS. 1 to 7, the semiconductor device 10 may set data input/output pads, embodied in the first semiconductor chip 20 and the second semiconductor chip 30, to be different from each other using bonding or means such as electronic fuses.

Furthermore, as illustrated in FIG. 1, in a process of assembling the semiconductor device 10 like an MCP, connecting package pads, which are closest to data input/output pads, with wires may improve productivity of the semiconductor device 10, and also improve features of the semiconductor device 10, e.g., reduce negative effects of capacitance.

Figure 8:
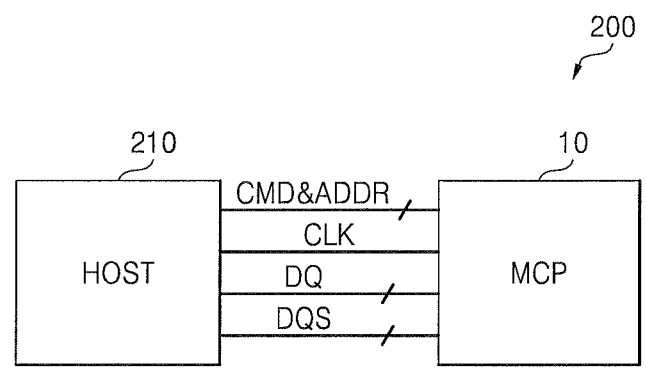
FIG. 8 is a block diagram of a system including the semiconductor device illustrated in FIG. 1, according to an exemplary embodiment of present inventive concept.

FIG. 8 is a block diagram of a system including the semiconductor device 10 illustrated in FIG. 1, according to an exemplary embodiment of present inventive concept.

Referring to FIG. 8, a system 200 may include the semiconductor device 10 and a host 210.

The system 200 may be embodied in a personal computer (PC), a server, or a portable electronic device.

The portable electronic device may be embodied in a laptop computer, a mobile phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book, for example.

The host 210 may be a central processing unit (CPU), a processor, a multi-core processor, an application processor, or a mobile application processor, for example.

The semiconductor device 10 and the host 210 may transmit or receive data DQ to each other using a DQS signal.

The host 210 may supply a command CMD, an address ADDR, and a clock signal CLK to the semiconductor device 10.

Figure 9:
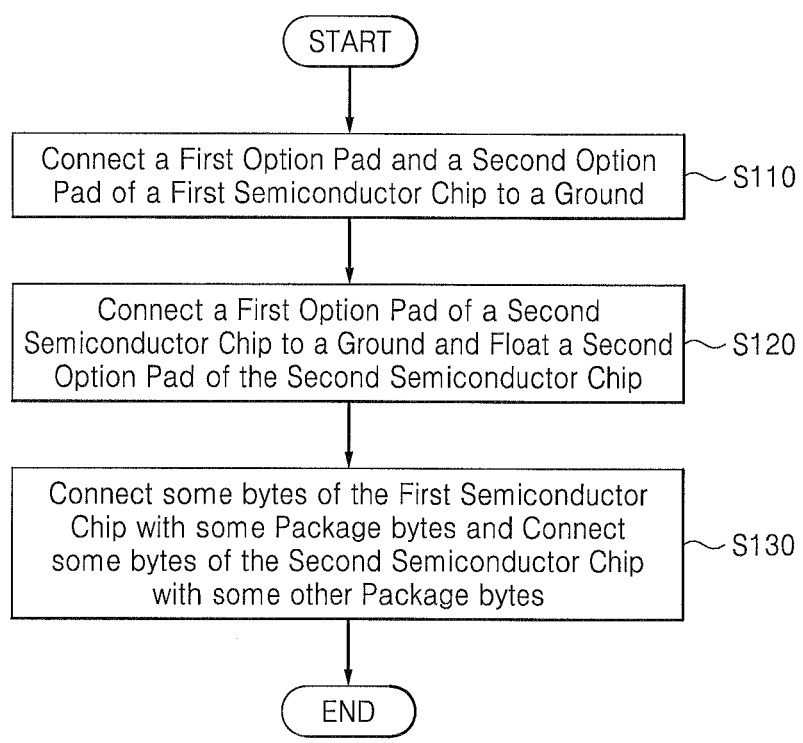
FIG. 9 is a flowchart of a method for manufacturing the semiconductor device illustrated in FIG. 1, according to an exemplary embodiment of present inventive concept.

FIG. 9 is a flowchart of a method for manufacturing the semiconductor device 10 illustrated in FIG. 1, according to an exemplary embodiment of present inventive concept.

Referring to FIGS. 1 and 9, the first option pad 21 and the second option pad 22 of the first semiconductor chip 20 are connected to the ground VSS (S110).

The first option pad 21 of the second semiconductor chip 30, which has substantially the same structure as the first semiconductor chip 20, is connected to the ground VSS, and the second option pad 22 of the second semiconductor chip 30 is floated (S120). The second option pad 22 of the second semiconductor chip 30 that is floated is recognized as a voltage having a high level by the option control circuit 100.

Byte2 and Byte3 of first bytes (or first pad groups) of the first semiconductor chip 20 are connected to PKG Byte2 and PKG Byte3 of package bytes formed on a package substrate, and Byte0 and Byte1 of second bytes (or second pad groups) of the second semiconductor chip 30 are connected to PKG Byte0 and PKG Byte1 of the package bytes (S130).

Byte2 and Byte3 of the first bytes are not overlapped with the Byte0 and Byte1 of the second bytes.

Byte2 & Byte3 of the first bytes and PKG Byte2 & PKG Byte3 of the package bytes are straightly connected to each other in a horizontal direction through first connection means, e.g., bonding wires, and the Byte0 and Byte1 of the second bytes and PKG Byte0 and PKG Byte1 of the package bytes are straightly connected to each other in the horizontal direction through second connection means, e.g., bonding wires.

The semiconductor device 10 including the first semiconductor chip 20 and the second semiconductor chip 30 may be embodied in an MCP or a package on package (PoP).

A semiconductor device according to an exemplary embodiment of the present inventive concept may set pads of an upper chip and pads of a lower chip, which are included in a package, to be different from each other, by using wire bonding or an electrical fusing circuit. Therefore, in a process of assembling the package, connecting bonding pads closest to each chip with wires may lead to an improvement in productivity and other features.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor device, comprising:
    a memory cell array;
    pad groups;
    a first option pad and a second option pad;
    a data input multiplexer block configured to transmit data, input through all or part of the pad groups, to the memory cell array based on whether the first option pad and a ground are connected to each other;
    data input buffer groups each connected to one of the pad groups;
    data strobe pad groups;
    data strobe input buffer groups each connected to one of the data strobe pad groups; and
    data input latch groups each connected between one of the data input buffer groups and the data input multiplexer block,
    wherein the data input multiplexer block is configured to select first pad groups among the pad groups or second pad groups among the pad groups as the part of the pad groups based on whether the second option pad and the ground are connected to each other,
    each of the data input buffer groups is configured to be enabled or disabled according to whether the first option pad and the ground are connected to each other and whether the second option pad and the ground are connected to each other,
    each of the data strobe input buffer groups is configured to be enabled or disabled according to whether the first option pad and the ground are connected to each other and whether the second option pad and the ground are connected to each other,
    each of the data input latch groups is configured to operate based on output signals of the data strobe input buffer group to which it is connected.

2. The semiconductor device of claim 1, further comprising a data output multiplexer block configured to output data from the memory cell array through all or the part of the pad groups based on whether the first option pad and the ground are connected to each other,
    wherein the data output multiplexer block is configured to select the first pad groups or the second pad groups as the part of the pad groups based on whether the second option pad and the ground are connected to each other.

3. The semiconductor device of claim 2, further comprising data output buffer groups each connected between the data output multiplexer block and one of the pad groups,
    wherein each of the data output buffer groups is configured to be enabled or disabled according to whether the first option pad and the ground are connected to each other and whether the second option pad and the ground are connected to each other.

4. A system, comprising:
    a semiconductor device; and
    a host configured to communicate with the semiconductor device, wherein the semiconductor device includes:
    a memory cell array;
    pad groups;

a first option pad and a second option pad;

a data input multiplexer block configured to transmit data, input from the host, to the memory cell array through all or part of the pad groups based on whether the first option pad and a ground are connected to each other;

data input buffer groups each connected to one of the pad groups;

data strobe pad groups;

data strobe input buffer groups each connected to one of the data strobe pad groups; and data input latch groups each connected between one of the data input buffer groups and the data input multiplexer block, wherein the data input multiplexer block is configured to select first pad groups among the pad groups or second pad groups among the pad groups as the part of the pad groups based on whether the second option pad and the ground are connected to each other, each of the data input buffer groups is configured to be enabled or disabled based on whether the first option pad and the ground are connected to each other and whether the second option pad and the ground are connected to each other, each of the data strobe input buffer groups is configured to be enabled or disabled according to whether the first option pad and the ground are connected to each other and whether the second option pad and the ground are connected to each other, each of the data input latch groups is configured to operate based on output signals of the data strobe input buffer group to which it is connected.

5. The system of claim 4, wherein the semiconductor device further comprises a data output multiplexer block configured to output data from the memory cell array through the all or the part of the pad groups based on whether the first option pad and the ground are connected to each other, wherein the data output multiplexer block is configured to select the first pad groups or the second pad groups as the part of the pad groups based on whether the second option pad and the ground are connected to each other.

6. The system of claim 5, wherein the semiconductor device further comprises data output buffer groups each connected between the data output multiplexer block and one of the pad groups, wherein each of the data output buffer groups is configured to be enabled or disabled based on whether the first option pad and the ground are connected to each other and whether the second option pad and the ground are connected to each other.

\* \* \* \* \*